US010818700B2

(12) United States Patent
Ma et al.

(10) Patent No.: US 10,818,700 B2
(45) Date of Patent: Oct. 27, 2020

(54) ARRAY SUBSTRATE, LIQUID CRYSTAL DISPLAY PANEL AND DISPLAY DEVICE

(71) Applicant: BOE Technology Group Co., Ltd., Beijing (CN)

(72) Inventors: Yongda Ma, Beijing (CN); Xinyin Wu, Beijing (CN); Yong Qiao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/374,931

(22) Filed: Apr. 4, 2019

(65) Prior Publication Data

US 2019/0229130 A1 Jul. 25, 2019

Related U.S. Application Data

(63) Continuation-in-part of application No. PCT/CN2018/100653, filed on Aug. 15, 2018.

(30) Foreign Application Priority Data

Sep. 5, 2017 (CN) .......................... 2017 1 0790394

(51) Int. Cl.
*H01L 27/12* (2006.01)
*G02F 1/1368* (2006.01)
*G02F 1/1362* (2006.01)

(52) U.S. Cl.
CPC .......... *H01L 27/124* (2013.01); *G02F 1/1368* (2013.01); *G02F 1/136227* (2013.01);
(Continued)

(58) Field of Classification Search
CPC ........... G02F 1/13345; G02F 1/134308; G02F 1/136227; H01L 27/12
See application file for complete search history.

(56) References Cited

U.S. PATENT DOCUMENTS 7,436,461 B2 * 10/2008 Choi ................. G02F 1/133345
349/139
2002/0089630 A1 7/2002 Liu et al.
(Continued)

FOREIGN PATENT DOCUMENTS

CN 1721925 A 1/2006
CN 101042502 A 9/2007
(Continued)

OTHER PUBLICATIONS

International Search Report for (PCT/CN2018/100653) dated Sep. 4, 2018.
(Continued)

*Primary Examiner* — Ermias T Woldegeorgis
(74) *Attorney, Agent, or Firm* — Arent Fox LLP; Michael Fainberg (57) ABSTRACT

The disclosure discloses an array substrate, a liquid crystal display panel, and a display device, and the array substrate includes: a base substrate; a plurality of pixel units with pixel electrodes on the base substrate; where each of at least a part of the plurality of pixel units is provided with at least one recess, and a pixel electrode in each of the at least a part of the plurality of pixel units covers the at least one recess; where an orthographic projection of an opening of each recess onto the base substrate overlaps with an orthographic projection of a bottom thereof onto the base substrate, and an area of the orthographic projection of the opening of the recess onto the base substrate is greater than an area of the orthographic projection of the bottom thereof onto the base substrate.

18 Claims, 5 Drawing Sheets

(52) U.S. Cl.
CPC ........ *G02F 1/136286* (2013.01); *H01L 27/12* (2013.01); *H01L 27/1218* (2013.01)

(56) References Cited

U.S. PATENT DOCUMENTS

| | | | |
|---|---|---|---|
| 2007/0058099 A1* | 3/2007 | Eguchi | G02F 1/136227 |
| | | | 349/43 |
| 2010/0201931 A1 | 8/2010 | Jang et al. | |
| 2012/0062814 A1* | 3/2012 | Yamazaki | H01L 29/24 |
| | | | 349/43 |
| 2013/0134414 A1* | 5/2013 | Yamazaki | H01L 29/7869 |
| | | | 257/43 |
| 2015/0108471 A1* | 4/2015 | Nakada | H01L 27/1255 |
| | | | 257/43 |
| 2017/0357134 A1 | 12/2017 | Wang et al. | |
| 2017/0358601 A1 | 12/2017 | Kim et al. | |
| 2019/0229130 A1 | 7/2019 | Ma et al. | |

FOREIGN PATENT DOCUMENTS

| | | |
|---|---|---|
| CN | 101799597 A | 8/2010 |
| CN | 105161499 A | 12/2015 |
| CN | 105355630 A | 2/2016 |
| CN | 107390443 A | 11/2017 |
| CN | 207366902 U | 5/2018 |
| JP | 2000039632 A | 2/2000 |
| JP | 2001083520 A | 3/2001 |
| KR | 20040001972 A | 1/2004 |
| KR | 20100059052 A | 6/2010 |

OTHER PUBLICATIONS

Chinese office action for 201710790394.9 dated May 5, 2019.
Chinese office action for 201710790394.9 dated Nov. 18, 2019.

* cited by examiner

ARRAY SUBSTRATE, LIQUID CRYSTAL DISPLAY PANEL AND DISPLAY DEVICE

This application is a continuation-in-part of International Application No. PCT/CN2018/100653, filed Aug. 15, 2018, which claims priority to Chinese Patent Application No. 201710790394.9, filed Sep. 5, 2017, both of which are hereby incorporated by reference in their entireties.

FIELD

This disclosure relates to the field of display technologies, and particularly to an array substrate, a liquid crystal display panel, and a display device.

BACKGROUND

A Liquid Crystal Display (LCD) has been widely applied to various fields due to its light weight, low drive voltage, low power consumption, and other advantages. As the market of liquid crystal displays is growing constantly, a number of display modes have emerged, e.g., a Twisted Nematic (TN) mode, an In-Plane Switching (IPS) mode, a Vertical Alignment (VA) mode, etc. At present, there is a growing demand of users for a liquid crystal display with a high quality, and particularly a liquid crystal display with a large screen and a wide angle of view.

SUMMARY

In one aspect, the embodiments of the disclosure provide an array substrate including: a base substrate; and a plurality of pixel units with pixel electrodes on the base substrate; where each of at least a part of the plurality of pixel units is provided with at least one recess, and a pixel electrode in each of the at least a part of the plurality of pixel units covers the at least one recess; where an orthographic projection of an opening of each recess onto the base substrate overlaps with an orthographic projection of a bottom of the recess onto the base substrate, and an area of the orthographic projection of the opening of the recess onto the base substrate is greater than an area of the orthographic projection of the bottom of the recess onto the base substrate; where the opening of the recess is on a side of the recess away from the base substrate, and the bottom of the recess is on a side of the recess proximate to the base substrate.

In some embodiments, the array substrate further includes: a reservation layer between the pixel electrode in each of the at least a part of the plurality of pixel units and the base substrate, and a first insulation layer between the reservation layer and the pixel electrode; where the first insulation layer includes at least one first via hole in a pixel unit with the pixel electrode, and the reservation layer includes at least one second via hole corresponding to the at least one first via hole in a one-to-one manner; an orthographic projection of each of the at least one first via hole onto the base substrate, and an orthographic projection of a corresponding second via hole onto the base substrate have an overlapping area; and each of the at least one recess includes one of the at least one first via hole and a corresponding second via hole.

In some embodiments, each of the at least one first via hole and each of the at least one second via hole include ellipses, and an orthographic projection of a long axis of each of the at least one second via hole onto the base substrate intersects with an orthographic projection of a long axis of a corresponding first via hole onto the base substrate.

In some embodiments, an angle between the orthographic projection of the long axis of each of the at least one second via hole onto the base substrate, and the orthographic projection of the long axis of the corresponding first via hole onto the base substrate is greater than 0 degree, and less than or equal to 90 degrees.

In some embodiments, the angle between the orthographic projection of the long axis of each of the at least one second via hole onto the base substrate, and the orthographic projection of the long axis of the corresponding first via hole onto the base substrate is equal to or greater than 35 degrees, and less than or equal to 75 degrees.

In some embodiments, the array substrate further includes a plurality of data lines and a plurality of gate lines; and the reservation layer is arranged at the same layer as the plurality of data lines; or the reservation layer is arranged at the same layer as the plurality of gate lines.

In some embodiments, the array substrate further includes a thin film transistor in the pixel unit with the pixel electrode; and the reservation layer is arranged at the same layer as an active layer of the thin film transistor.

In some embodiments, the array substrate further includes a gate insulation layer located between the active layer of the thin film transistor and a layer at which a gate of the thin film transistor is located, where the gate insulation layer includes at least one third via hole corresponding to the at least one first via hole in a one-to-one manner; the orthographic projection of each of the at least one first via hole onto the base substrate, and an orthographic projection of a corresponding third via hole onto the base substrate have an overlapping area; and each of the at least one recess includes one of the at least one first via hole, a corresponding second via hole, and a corresponding third via hole.

In some embodiments, the array substrate further includes: a gate insulation layer located between the active layer of the thin film transistor and a layer at which a gate of the thin film transistor is located, and an auxiliary layer located between the gate insulation layer and the base substrate; the auxiliary layer includes at least one fourth via hole corresponding to the at least one first via hole in a one-to-one manner; and an orthographic projection of each of the at least one first via hole onto the base substrate, and an orthographic projection of a corresponding fourth via hole onto the base substrate have an overlapping area; and each of the at least one recess includes one of the at least one first via hole, a corresponding second via hole, and a corresponding fourth via hole.

In some embodiments, each of the at least one fourth via hole includes a tapered hole; and an angle between an inclined surface of the tapered hole, and an upper surface of the base substrate is greater than or equal to 15 degrees, and less than or equal to 75 degrees.

In some embodiments, the array substrate further includes a plurality of gate lines, and a common electrode arranged at the same layer as the plurality of gate lines; and the auxiliary layer is arranged at the same layer as, and insulated from, the plurality of gate lines.

In some embodiments, the gate insulation layer includes at least one third via hole corresponding to the at least one first via hole in a one-to-one manner; the orthographic projection of each of the at least one first via hole onto the base substrate, and an orthographic projection of a corresponding third via hole onto the base substrate have an overlapping area; and each of the at least one recess includes one of the at least one first via hole, a corresponding second via hole, a corresponding third via hole, and a corresponding fourth via hole.

In some embodiments, the reservation layer includes a first sub-reservation layer and a second sub-reservation layer; and the array substrate further includes a thin film transistor in the pixel unit with the pixel electrode, where the first sub-reservation layer is arranged at the same layer as a source of the thin film transistor, and the second sub-reservation layer is arranged at the same layer as an active layer of the thin film transistor.

In some embodiments, each of the first sub-reservation layer and the second sub-reservation layer includes at least one elliptical second via hole corresponding to the at least one first via hole in a one-to-one manner, and an orthographic projection of a long axis of each of the at least one elliptical second via hole arranged on the first sub-reservation layer onto the base substrate intersects with an orthographic projection of a long axis of a corresponding elliptical second via hole arranged on the second sub-reservation layer onto the base substrate.

In some embodiments, an orthographic projection of a center of each of the at least one elliptical second via hole arranged on the first sub-reservation layer onto the base substrate overlaps with an orthographic projection of a center of the corresponding elliptical second via hole arranged on the second sub-reservation layer onto the base substrate.

In some embodiments, the array substrate further includes a thin film transistor in each of the at least a part of the plurality of pixel units, a gate insulation layer between an active layer of the thin film transistor and a layer at which a gate of the thin film transistor is located, and an auxiliary layer located between the gate insulation layer and the base substrate; the gate insulation layer includes at least one third via hole in each of the at least a part of the plurality of pixel units, the auxiliary layer includes at least one fourth via hole corresponding to the at least one third via hole in a one-to-one manner; an orthographic projection of each of the at least one third via hole onto the base substrate, and an orthographic projection of a corresponding fourth via hole onto the base substrate have an overlapping area; and each of the at least one recess includes one of the at least one third via hole, and a corresponding fourth via hole.

In some embodiments, the array substrate further includes a reservation layer between the pixel electrode in each of the at least a part of the plurality of pixel units and the base substrate, the reservation layer is arranged at the same layer as the active layer of the thin film transistor, and the reservation layer includes at least one second via hole corresponding to the at least one third via hole in a one-to-one manner; an orthographic projection of each of the at least one second via hole onto the base substrate, and an orthographic projection of a corresponding third via hole onto the base substrate have an overlapping area; and each of the at least one recess includes one of the at least one third via hole, a corresponding fourth via hole and a corresponding second via hole.

In some embodiments, each of the at least one recess is on an upper surface of the base substrate; and a thickness of the base substrate in an area where each of the at least one recess is located is less than a thickness of the base substrate in the other areas.

In another aspect, the embodiments of the disclosure further provide a liquid crystal display panel including the array substrate according to the embodiments of the disclosure.

In still another aspect, the embodiments of the disclosure further provide a display device including the liquid crystal display panel according to the embodiments of the disclosure.

DETAILED DESCRIPTION OF THE EMBODIMENTS

In order to increase the angle of view of a LCD device, a wide angle of view technique such as a patterned vertical alignment (PVA) mode, the IPS mode, and the like has been developed. When the LCD device adopts the PVA mode, a slit is formed in a common electrode of a color filter substrate to form a twisted electric field between the common electrode and each pixel electrode of a TFT substrate. However, a distribution of the liquid crystal on the slit may be uncontrolled, which will result in a decrease in an aperture ratio of the LCD device. In particular, when a small-sized LCD device adopts the PVA mode, the aperture ratio of the small-sized LCD device is greatly reduced, so that the brightness of the small-sized LCD device is lowered.

When the LCD device adopts the IPS mode, the TFT substrate includes two electrodes arranged in parallel with each other. Thus, the electric field is distorted, causing the brightness of the LCD device to drop. Further, when surfaces of the color filter substrate and the TFT substrate are rubbed to align the liquid crystal, the surfaces may be irregularly rubbed so that the image display quality is degraded.

In view of above, the embodiments of the disclosure provide an array substrate, a liquid crystal display panel, and a display device to increase an angle of view of a display device and improve the image display effect thereof.

The technical solutions according to the embodiments of the disclosure will be described below clearly and fully with reference to the drawings in the embodiments of the disclosure, and apparently the embodiments to be described are only a part but not all of the embodiments of the disclosure. Based upon the embodiments here of the disclosure, all the other embodiments which can occur to those ordinarily skilled in the art without any inventive effort shall fall into the claimed scope of the disclosure.

Figure 1:
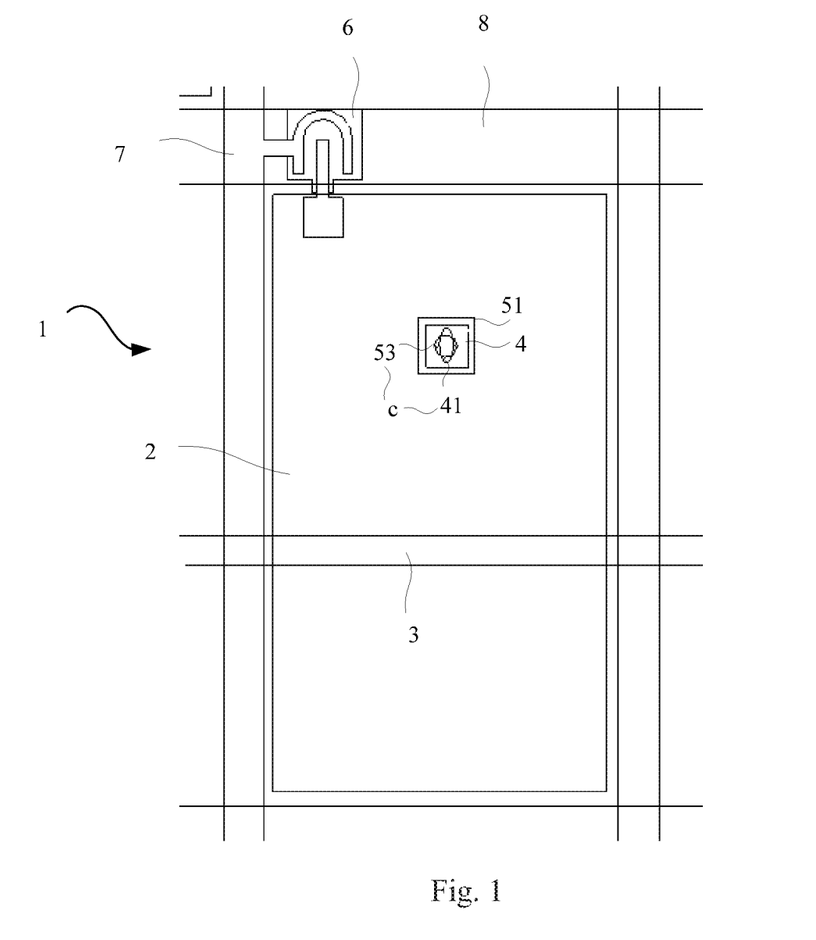
FIG. 1 is a first schematic structural diagram of an array substrate according to the embodiments of the disclosure in a top view.
Figure 2:
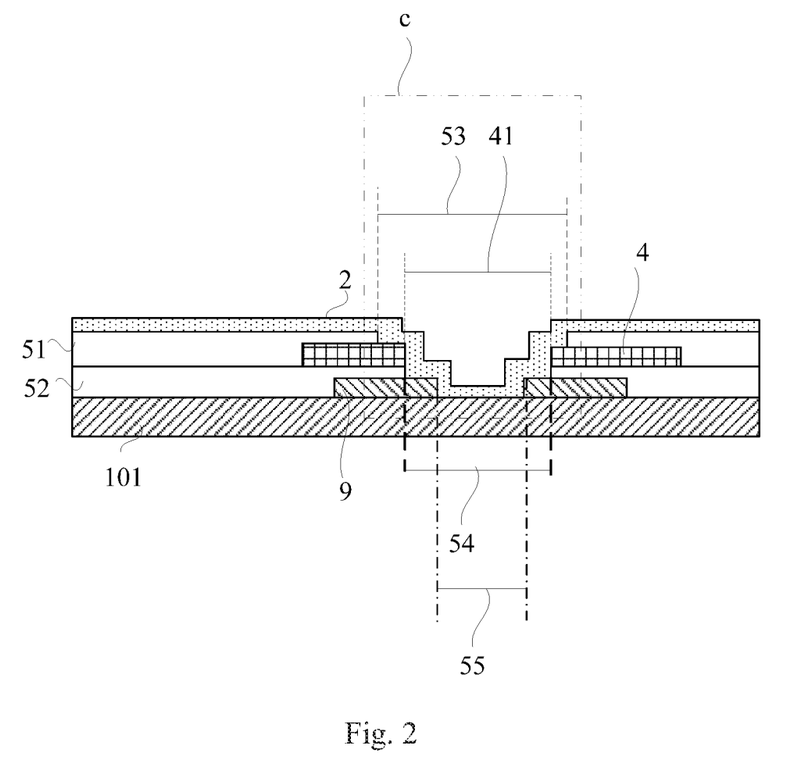
FIG. 2 is a first schematic structural diagram of the array substrate according to the embodiments of the disclosure in a partially sectional view.
Figure 3:
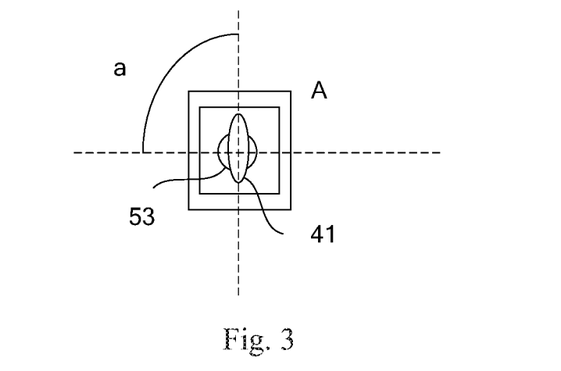
FIG. 3 is a schematic structural diagram of a first via hole and a second via hole according to the embodiments of the disclosure.

As illustrated in FIG. 1, FIG. 2, and FIG. 3, an array substrate according to the embodiments of the disclosure includes: a base substrate 101, and a plurality of pixel units 1 with pixel electrodes 2 on the base substrate 101; where each of at least a part of the plurality of pixel units 1 is provided with at least one recess c, and a pixel electrode 2 located in in each of the at least a part of the plurality of pixel units 1 covers the at least one recess c; where an orthographic projection of an opening of each recess c onto the base substrate 101 overlaps with an orthographic projection of a bottom of the recess c onto the base substrate 101, and an area of the orthographic projection of the opening of the recess c onto the base substrate 101 is greater than an area of the orthographic projection of the bottom of the recess c onto the base substrate 101; where the opening of the recess c is on a side of the recess c away from the base substrate 101, and the bottom of the recess c is on a side of the recess c proximate to the base substrate 101.

In the array substrate according to the embodiments of the disclosure, recesses are arranged in at least a part of pixel units, the orthographic projection of the opening of each recess onto the base substrate and the orthographic projection of the bottom thereof onto the base substrate have an overlapping area, and the area of the orthographic projection of the opening of each recess onto the base substrate is greater than the area of the orthographic projection of the bottom thereof onto the base substrate; and pixel electrodes cover the recesses so that the pixel electrodes can be formed with recess areas and circumferential depth differences exist in the recess areas of the pixel electrodes. Furthermore, when the array substrate is applied to a liquid crystal display panel, electric fields around the recess areas of the pixel electrodes can vary along a circumferential direction. Stated otherwise, since the pixel electrodes have recess areas, an electric field between the pixel electrodes and a common electrode can vary so that liquid crystal molecules are arranged in a direction of the electric field to form a multi-domain state, and thus a multi-domain liquid crystal display can be achieved. Furthermore, the liquid crystal display panel according to the embodiments of the disclosure can have an extended angle of view, and thus the display effect of the image can be improved.

In some embodiments, in the array substrate according to the embodiments of the disclosure, a pixel unit 1 provided with at least one recess c is generally a pixel unit with a certain visual effect in a set area of the base substrate 101, e.g. a pixel unit in a middle area or an edge area of a display area of the base substrate 101. Of course, in order to further increase the angle of view of the liquid crystal display panel to thereby further improve the display effect of the image, each of the plurality of pixel units 1 in the array substrate can be provided with at least one recess c, which will not be limited herein.

In some embodiments, in the array substrate according to the embodiments of the disclosure, as illustrated in FIG. 1, FIG. 2, and FIG. 3, the array substrate further includes: a reservation layer 4 between the pixel electrode 2 in each of the at least a part of the plurality of pixel units 1 and the base substrate 101, and a first insulation layer 51 between the reservation layer 4 and the pixel electrode 2, where the first insulation layer 51 includes at least one first via hole 53 in the pixel unit 1 with the pixel electrode 2, and the reservation layer 4 includes a second via hole 41 corresponding to each first via hole 53; where an orthographic projection of each first via hole 53 onto the base substrate 101, and an orthographic projection of a corresponding second via hole 41 onto the base substrate 101 have an overlapping area; and each recess c can include a first via hole 53 and a corresponding second via hole 41.

In this way, a reservation layer 4 is formed on the base substrate 101 before the pixel electrode 2 is formed, and an orthographic projection of each second via hole 41 in the reservation layer 4 onto the base substrate 101 overlaps with an orthographic projection of a corresponding first via hole 53 in the first insulation layer 51 onto the base substrate 101 to form a recess c, so that a depth of each recess c can be increased to generate a more distinct depth difference in a circumferential direction of each recess c, and thus an electric field around a recess area of the pixel electrode can vary more strongly along a circumferential direction to thereby further increase the angle of view of the liquid crystal display panel and further improve the multi-domain display effect of the image. In some embodiments, the orthographic projection of each first via hole 53 onto the reservation layer 4 covers at least an area of the reservation layer 4 in which no second via hole 41 is arranged, so that the pixel electrode can come into contact with the reservation layer, to thereby improve the adhesiveness of the pixel electrode and prevent a poor contact and poor display effect phenomenon from happening due to a low adhesiveness of the pixel electrode caused by a long slope of the recess.

In some embodiments, in the array substrate according to the embodiments of the disclosure, as illustrated in FIG. 1, FIG. 2, and FIG. 3, a pattern of each second via hole 41 includes an ellipse, and a pattern of each first via hole 53 can also include an ellipse, and an orthographic projection of a long axis of each second via hole 41 onto the base substrate 101 intersects with an orthographic projection of a long axis of a corresponding first via hole 53 onto the base substrate 101, thus facilitating a formation of a recess with an irregular shape and different circumferential depths, so that it is beneficial for an electric field to enhance the control of liquid crystal molecules in multiple directions, thereby light emitting angles of the liquid crystal molecules in multiple directions can be improved, which will further increase the angle of view of the liquid crystal display panel and further improve the multi-domain display effect of the image. Further, a minor axis of each first via hole 53 can be equal to or greater than a minor axis of each second via hole 41, which will not be limited herein.

In some embodiments, an angle a between the orthographic projection of the long axis of each second via hole 41 onto the base substrate 101, and the orthographic projection of the long axis of the corresponding first via hole 53 onto the base substrate 101 can be one of a number of angles, for example, the angle a is greater than 0 degree, and less than or equal to 90 degrees, such as 15 degrees, 20 degrees, 25 degrees, 30 degrees, 34 degrees, 40 degrees, 55 degrees, 59 degrees, 70 degrees, 78 degrees, 83 degrees, 88 degrees, 90 degrees, etc., although a repeated description thereof will be omitted here. In some embodiments, the angle a between the orthographic projection of the long axis of each second via hole 41 onto the base substrate 101, and the orthographic projection of the long axis of the corresponding first via hole 53 onto the base substrate 101 is equal to or greater than 35 degrees, and less than or equal to 75 degrees. In this angle range, it is easier to realize a multi-domain liquid crystal display.

In some embodiments, when the pattern of each second via hole 41 includes an ellipse, the pattern of each first via hole 53 can alternatively include a circle, and a diameter thereof can be greater than a minor axis of a corresponding second via hole 41. Further, it shall be noted that, the patterns of each second via hole 41 and each first via hole 53 can be set to a different combination of shapes as needed, for example, the pattern of each second via hole 41 includes an ellipse or a circle, and the pattern of each first via hole 53 includes an ellipse. That is, for a first via hole 53 and a corresponding second via hole 41, both the first via hole 53 and the second via hole 41 can be ellipses, or one of the first via hole 53 and the second via hole 41 is an ellipse and the other is a circle. Of course, both the first via hole 53 and the second via hole 41 can alternatively be circles or each of the first via hole 53 and the second via hole 41 can be set to another shape than the ellipse or circle as needed, which will not be limited herein.

Figure 4:
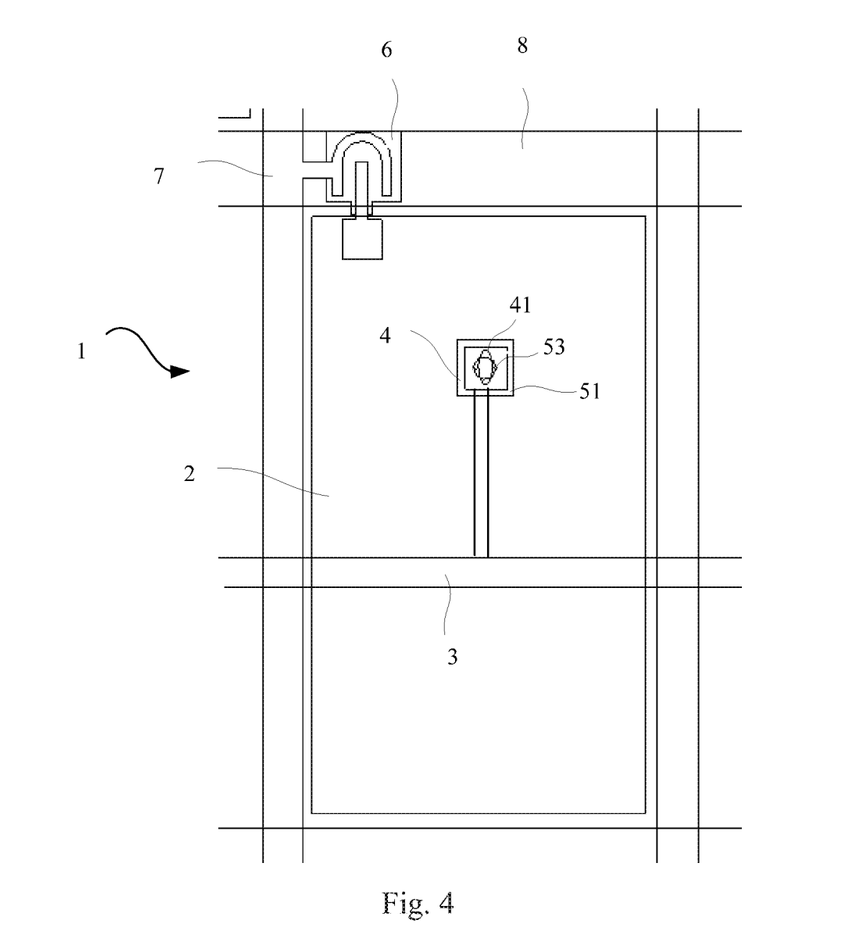
FIG. 4 is a second schematic structural diagram of the array substrate according to the embodiments of the disclosure in a top view.

In some embodiments, as illustrated in FIG. 1 and FIG. 4, the array substrate further includes: a plurality of data lines 7 extending in a column direction, a plurality of gate lines 8 extending in a row direction, and thin film transistors in respective pixel units; where each thin film transistor includes a gate, an active layer 6, and a source and a drain electrically connected with the active layer, which are located on the base substrate in that order. And the array substrate further includes: a gate insulation layer between active layers and a layer at which gates are located, a second insulation layer between the active layers and a layer at which sources and drains are located, a third insulation layer between the layer at which the sources and the drains are located and a layer at which the pixel electrodes are located. The sources and the drains are electrically connected with the active layers through via holes extending through the second insulation layer. The pixel electrodes are electrically connected with the drains of the thin film transistors through via holes extending through the third insulation layer. The gates of the thin film transistors are electrically connected with the gate lines, the sources are electrically connected with the data lines. Further, the data lines can be arranged at the same layer, and made of the same material, as the sources and the drains of the thin film transistors. The gate lines can be arranged at the same layer, and made of the same material, as the gates of the thin film transistors.

In some embodiments, as illustrated in FIG. 1 and FIG. 4, the array substrate further includes a common electrode 3. In a practical application, the shapes of the pixel electrodes and the common electrode can be set as needed in reality, and there may be a number of particular positions of the common electrode 3. In some embodiments, the common electrode 3 is arranged at the same layer as the gate lines 8. In this way, the liquid crystal molecules can be driven by an electric field between the common electrode and the pixel electrodes for an effect of forming the multi-domain liquid crystal. This structural arrangement can simplify a fabrication process, and make it convenient to fabricate the array substrate.

In some embodiments, the reservation layer 4 can be arranged at the same layer, and made of the same material, as the data lines 7. In this way, the patterns of the reservation layer and the data lines can be formed in one patterning process to thereby simplify a fabrication process, save a production cost, and improve the production efficiency. At this time, since the data lines can be arranged at the same layer as the sources and the drains of the thin film transistors, the third insulation layer can be used as the first insulation layer. Further, since the reservation layer can come into contact with the pixel electrodes to improve the adhesiveness of the pixel electrodes, the reservation layer can be electrically connected with the drains via the pixel electrodes; of course, the reservation layer can alternatively be set to be not electrically connected with any of the data lines, the sources and the drains, although the embodiments of the disclosure will not be limited thereto.

Alternatively, the reservation layer can be arranged at the same layer, and made of the same material, as the gate lines. In this way, the patterns of the reservation layer and the gate lines can be formed in one patterning process to thereby simplify a fabrication process, save a production cost, and improve the production efficiency. At this time, the gate insulation layer, the second insulation layer and the third insulation layer can be used as the first insulation layer.

Alternatively, the reservation layer can be arranged at the same layer, and made of the same material, as the active layers of the thin film transistors. In this way, the patterns of the reservation layer and the active layers can be formed in one patterning process to thereby simplify a fabrication process, save a production cost, and improve the production efficiency. At this time, the second insulation layer and the third insulation layer can be used as the first insulation layer.

It shall be noted that, the material of the reservation layer can also be another metal or semiconductor material different from the material of the data lines 7, the gate lines 8, or the active layers, etc., which will not be limited herein.

In some embodiments, as illustrated in FIG. 2, the gate insulation layer 52 includes a third via hole 54 corresponding to each first via hole 53 or each second via hole 41; the orthographic projection of each first via hole 53 onto the base substrate 101, and an orthographic projection of a corresponding third via hole 54 onto the base substrate 101 have an overlapping area; or the orthographic projection of each second via hole 41 onto the base substrate 101, and an orthographic projection of a corresponding third via hole 54 onto the base substrate 101 have an overlapping area; and each recess c can include a first via hole 53, a corresponding second via hole 41, and a corresponding third via hole 54. In this way, a gradient of each recess c can be increased to thereby further increase the depth thereof, so that a more distinct depth difference in a circumferential direction of each recess c and thus a more distinct depth difference in a circumferential direction of a recess area of a corresponding pixel electrode can be generated, thus an electric field around the recess area of the pixel electrode can vary more strongly along a circumferential direction to thereby further increase the angle of view of the liquid crystal display panel and further improve the multi-domain display effect of the image.

In some embodiments, alike each first via hole 53 and each second via hole 41, each third via hole 54 can be an ellipse or a circle. And when each first via hole 53, each second via hole 41, and each third via hole 54 are ellipses, an orthographic projection of a long axis of each third via hole 54 onto the base substrate 101 intersects with an orthographic projection of a long axis of a corresponding first via hole 53 or a corresponding second via hole 41 onto the base substrate 101, thus facilitating a formation of a recess with an irregular shape and different circumferential depths, so that it is beneficial for an electric field to enhance the control of liquid crystal molecules in multiple directions, thereby light emitting angles of the liquid crystal molecules in multiple directions can be improved, which will farther increase the angle of view of the liquid crystal display panel and further improve the multi-domain display effect of the image.

In some embodiments, alike the angle a between the orthographic projection of the long axis of each second via hole 41 onto the base substrate 101, and the orthographic projection of the long axis of the corresponding first via hole 53 onto the base substrate 101, an angle between the orthographic projection of the long axis of each third via hole 54 onto the base substrate 101, and the orthographic projection of the long axis of the corresponding first via hole 53 or the corresponding second via hole 41 onto the base substrate 101 can be greater than 0 degree, and less than or equal to 90 degrees, for example, equal to or greater than 35 degrees, and less than or equal to 75 degrees.

In some embodiments, a minor axis of each second via hole 41 can be equal to or greater than a minor axis of each third via hole 54. And in some embodiments, the orthographic projection of each second via hole 41 onto the base substrate 101 can cover and be greater than an orthographic projection of a corresponding third via hole 54 onto the base substrate 101.

Figure 5:
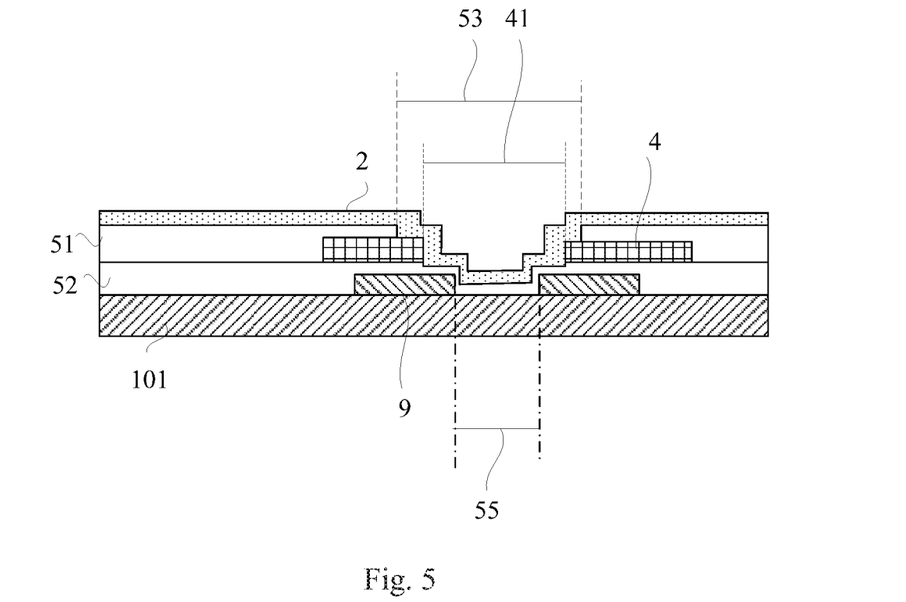
FIG. 5 is a second schematic structural diagram of the array substrate according to the embodiments of the disclosure in a partially sectional view.

In some embodiments, as illustrated in FIG. 2 and FIG. 5, the array substrate further includes: an auxiliary layer 9 located between the gate insulation layer 52 and the base substrate 101; the auxiliary layer 9 includes a fourth via hole 55 corresponding to each first via hole 53 or each second via hole 41; the orthographic projection of each first via hole 53 onto the base substrate 101, and an orthographic projection of a corresponding fourth via hole 55 onto the base substrate 101 have an overlapping area; or the orthographic projection of each second via hole 41 onto the base substrate 101 and an orthographic projection of a corresponding fourth via hole 55 onto the base substrate 101 have an overlapping area; and each recess c can include a first via hole 53, a corresponding second via hole 41, and a corresponding fourth via hole 55, so that there are more steps of each recess c to thereby further increase the depth thereof. In this way, the pixel electrode can be further contacted with the auxiliary layer 9 through the first via hole 53, the second via hole 41, and the fourth via hole 55 to thereby further improve the adhesiveness of the pixel electrode.

In some embodiments, alike each first via hole 53 and each second via hole 41, each fourth via hole 55 can be an ellipse or a circle. And when each first via hole 53, each second via hole 41, and fourth via hole 55 are ellipses, an orthographic projection of a long axis of each fourth via hole 55 onto the base substrate 101 intersects with an orthographic projection of a long axis of a corresponding first via hole 53 or a corresponding second via hole 41 onto the base substrate 101, thus facilitating a formation of a recess with an irregular shape and different circumferential depths, so that it is beneficial for an electric field to enhance the control of liquid crystal molecules in multiple directions, thereby light emitting angles of the liquid crystal molecules in multiple directions can be improved, which will further increase the angle of view of the liquid crystal display panel and further improve the multi-domain display effect of the image.

In some embodiments, alike the angle a between the orthographic projection of the long axis of each second via hole 41 onto the base substrate 101, and the orthographic projection of the long axis of the corresponding first via hole 53 onto the base substrate 101, an angle between the orthographic projection of the long axis of each fourth via hole 55 onto the base substrate 101, and the orthographic projection of the long axis of the corresponding first via hole 53 or the corresponding second via hole 41 onto the base substrate 101 can be greater than 0 degree, and less than or equal to 90 degrees, for example, equal to or greater than 35 degrees, and less than or equal to 75 degrees.

In some embodiments, a minor axis of each second via hole 41 can be equal to or greater than a minor axis of each fourth via hole 55. And in some embodiments, the orthographic projection of each second via hole 41 onto the base substrate 101 can cover and be greater than an orthographic projection of a corresponding fourth via hole 55 onto the base substrate 101.

Figure 6:
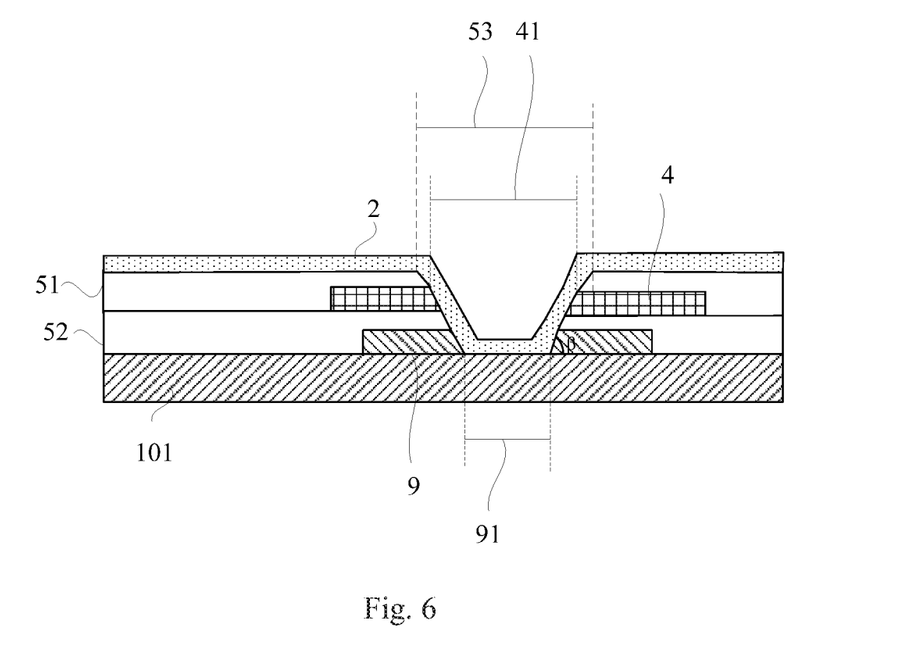
FIG. 6 is a third schematic structural diagram of the array substrate according to the embodiments of the disclosure in a partially sectional view.

In some embodiments, as illustrated in FIG. 6, each fourth via hole includes a tapered hole 91, where an angle β between an inclined surface of the tapered hole 91, and an upper surface of the base substrate 101 is greater than or equal to 15 degrees, and less than or equal to 75 degrees. In this way, the effect of the multi-domain display can be improved. Where the angle above can be 15 degrees, 25 degrees, 30 degrees, 35 degrees, 40 degrees, 45 degrees, 60 degrees, 70 degrees, 75 degrees, etc., although a repeated description thereof will be omitted here. Further, in order to facilitate fabrication, each first via hole 53, each second via hole 41, and each third via hole 54 can also be tapered holes.

In some embodiments, the auxiliary layer can be located at the same layer as, and arranged insulated from, the gate lines. Where the auxiliary layer may or may not be made of the same material as the gate lines, although the embodiments of the disclosure will not be limited thereto.

In some embodiments, as illustrated in FIG. 1 and FIG. 2, the auxiliary layer 9 can be arranged insulated from the gate lines and the common electrode so that the gate insulation layer 52 can include the third via holes 54. As illustrated in FIG. 4 and FIG. 5, the auxiliary layer 9 can be arranged insulated from the gate lines, and the auxiliary layer 9 can be electrically connected with the common electrode (as illustrated in FIG. 4, the two parallel lines connected with the common electrode 3 and extending longitudinally to the recess represent that the auxiliary layer can be electrically connected with the common electrode), so that the gate insulation layer 52 will not include the third via holes 54 to thereby avoid the pixel electrodes 2 from being electrically connected with the common electrode 3.

Further, it shall be noted that, in the array substrate according to the embodiments of the disclosure, each recess c can have other composition forms than the above forms, for example, each recess c can include a first via hole 53, a corresponding second via hole 41, a corresponding third via hole 54 and a corresponding fourth via hole 55; or can include a third via hole 54 and a corresponding fourth via hole 55; or include a second via hole 41, a corresponding third via hole 54 and a corresponding fourth via hole 55; or include a second via hole 41 and a corresponding third via hole 54; or only include a first via hole 53 or a fourth via hole 55, as long as after other layers are arranged on the base substrate, the other layers will be formed with a recess area, and a pixel electrode 2 can further be formed with a recess area to thereby realize a multi-domain display.

Figure 7:
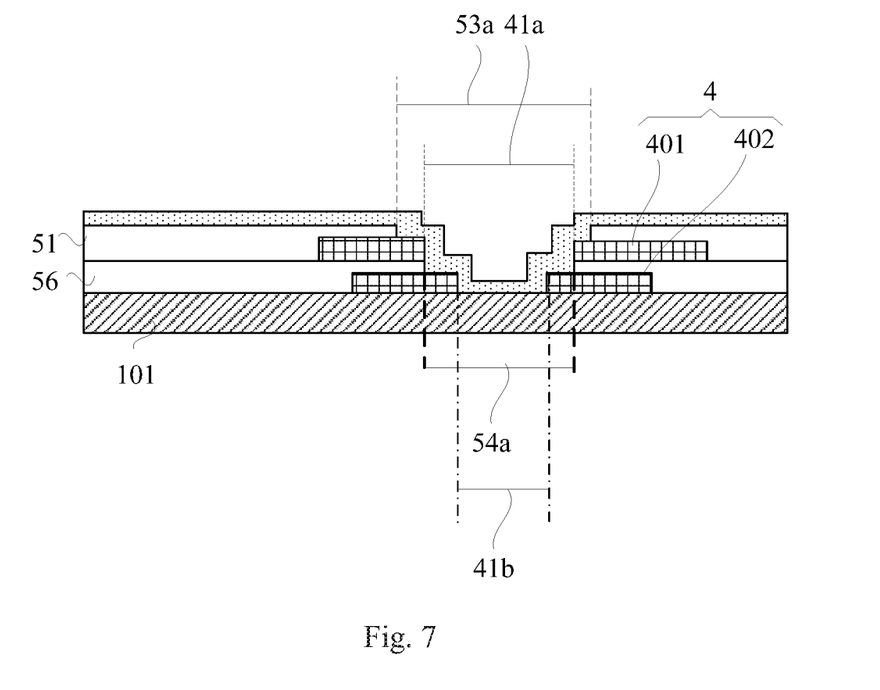
FIG. 7 is a fourth schematic structural diagram of the array substrate according to the embodiments of the disclosure in a partially sectional view.

In some embodiments, as illustrated in FIG. 7, the reservation layer 4 includes: a first sub-reservation layer 401 and a second sub-reservation layer 402, where the first sub-reservation layer 401 is arranged at the same layer as the sources of the thin film transistors, and the second sub-reservation layer 402 is arranged at the same layer as the active layers of the thin film transistors. Further, each first via hole includes: a first sub-via hole 53a extending through the first insulation layer, and a second sub-via hole 54a extending through the second insulation layer 56. The first sub-reservation layer 401 includes a second via hole 41a, and the second sub-reservation layer 402 includes a second via hole 41b. In this way, the number of steps of each recess can be increased to thereby further increase the depth difference of the recess so as to improve the effect of the multi-domain display.

In some embodiments, the patterns of each second via hole 41a and each second via hole 41b can include ellipses, and the patterns of each first sub-via hole 53a and each second sub-via hole 54a can also include ellipses. For example, when each second via hole 41a and each second via hole 41b are ellipses, an orthographic projection of a long axis of each second via hole 41a arranged on the first sub-reservation layer 401 onto the base substrate 101 intersects with an orthographic projection of a long axis of a corresponding second via hole 41b arranged on the second sub-reservation layer 402 onto the base substrate 101. In this way, it is beneficial to form a recess with an irregular shape and different circumferential depths to thereby make an electric field around each recess area of the pixel electrode more variable so as to further improve the effect of the multi-domain display.

In some embodiments, an angle between the orthographic projection of the long axis of each second via hole 41a arranged on the first sub-reservation layer 401 onto the base substrate 101, and the orthographic projection of the long axis of the corresponding second via hole 41b arranged on the second sub-reservation layer onto the base substrate 101 is greater than 0 degree, and less than or equal to 90 degrees, e.g., 15 degrees, 20 degrees, 25 degrees, 30 degrees, 34 degrees, 40 degrees, 55 degrees, 59 degrees, 70 degrees, 78 degrees, 83 degrees, 88 degrees, 90 degrees, etc., although a repeated description thereof will be omitted here. In some embodiments, the angle between the orthographic projection of the long axis of each second via hole 41a onto the base substrate 101, and the orthographic projection of the long axis of the corresponding second via hole 41b onto the base substrate 101 is greater than or equal to 35 degrees, and less than or equal to 75 degrees.

In some embodiments, in order to facilitate fabrication, and to improve the effect of the multi-domain display, an orthographic projection of a center of the first sub-via hole 53a extending through the first insulation layer onto the base substrate, an orthographic projection of a center of the second sub-via hole 54a extending through the second insulation layer 56 onto the base substrate, an orthographic projection of a center of a corresponding second via hole arranged on the first sub-reservation layer onto the base substrate, and an orthographic projection of a center of a corresponding second via hole arranged on the second sub-reservation layer onto the base substrate overlap with each other, so that for a same recess, the orthographic projections of centers of a first via hole and a second via hole onto the base substrate 101 can overlap with each other.

Further, it shall be noted that, for the same recess, orthographic projections of centers of the other via holes such as a third via hole and/or a fourth via hole onto the base substrate 101 can also overlap with the orthographic projections of the centers of the first via hole and the second via hole onto the base substrate 101.

Figure 8:
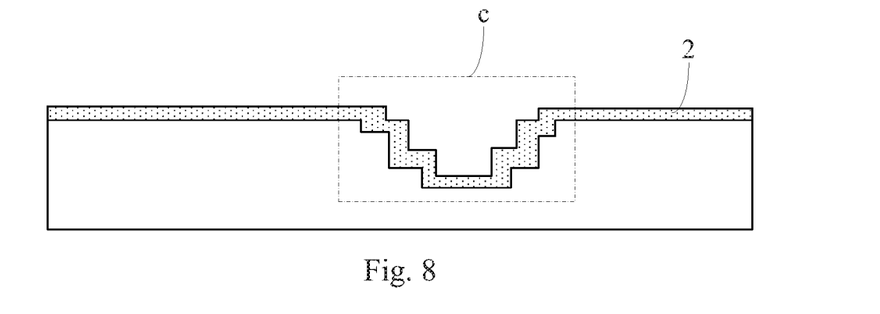
FIG. 8 is a fifth schematic structural diagram of the array substrate according to the embodiments of the disclosure in a partially sectional view.

In some embodiments, as illustrated in FIG. 8, each recess c is arranged on the upper surface of the base substrate 101, where a thickness of the base substrate 101 in an area where the recess c is located is less than a thickness of the base substrate 101 in the other areas. In this way, after the other layers are arranged on the base substrate, the other layers will be formed with a recess area, and a pixel electrode 2 can further cover the recess c so that the pixel electrode 2 can be formed with a recess area to thereby realize a multi-domain display.

Based upon the same inventive idea, the embodiments of the disclosure further provide a liquid crystal display panel including the array substrate according to the embodiments of the disclosure. The liquid crystal display panel addresses the problem under a similar principle to the array substrate above, so reference can be made to the implementation of the array substrate above for an implementation of the liquid crystal display panel, and a repeated description thereof will be omitted here.

In some embodiments, the liquid crystal display panel can further include: an opposite substrate arranged opposite to the array substrate, and a liquid crystal layer encapsulated between the array substrate and the opposite substrate.

Based upon the same inventive idea, the embodiments of the disclosure further provide a display device including the liquid crystal display panel according to the embodiments of the disclosure. Since the liquid crystal display panel can have an extended angle of view, and thus an improved image display effect, the display device according to the embodiments of the disclosure has a better display effect.

In some embodiments, the display device according to the embodiments of the disclosure can be a mobile phone, a tablet computer, a TV set, a monitor, a notebook computer, a digital photo frame, a navigator, or any other product or component with a display function. All the other components indispensable to the display device shall readily occur to those ordinarily skilled in the art, so a repeated description thereof will be omitted here, and the embodiments of the disclosure will not be limited thereto.

Evidently those skilled in the art can make various modifications and variations to the invention without departing from the spirit and scope of the disclosure. Thus the invention is also intended to encompass these modifications and variations thereto so long as the modifications and variations come into the scope of the claims appended to the invention and their equivalents.

The invention claimed is:

1. An array substrate, comprising:
a base substrate; and
a plurality of pixel units with pixel electrodes on the base substrate;
wherein each of at least a part of the plurality of pixel units is provided with at least one recess, and a pixel electrode in each of the at least a part of the plurality of pixel units covers the at least one recess;
wherein an orthographic projection of an opening of each recess onto the base substrate overlaps with an orthographic projection of a bottom of the recess onto the base substrate, and an area of the orthographic projection of the opening of the recess onto the base substrate is greater than an area of the orthographic projection of the bottom of the recess onto the base substrate;
wherein the opening of the recess is on a side of the recess away from the base substrate, and the bottom of the recess is on a side of the recess proximate to the base substrate;
wherein the array substrate further comprises: a reservation layer between the pixel electrode in each of the at least a part of the plurality of pixel units and the base substrate, and a first insulation layer between the reservation layer and the pixel electrode;
the first insulation layer comprises at least one first via hole in a pixel unit with the pixel electrode, and the reservation layer comprises at least one second via hole corresponding to the at least one first via hole in a one-to-one manner;
an orthographic projection of each of the at least one first via hole onto the base substrate, and an orthographic projection of a corresponding second via hole onto the base substrate have an overlapping area; and
each of the at least one recess comprises one of the at least one first via hole and a corresponding second via hole;

wherein each of the at least one first via hole and each of the at least one second via hole include ellipses; and an orthographic projection of a long axis of each of the at least one second via hole onto the base substrate intersects with an orthographic projection of a long axis of a corresponding first via hole onto the base substrate.

2. The array substrate according to claim 1, wherein the array substrate further comprises a thin film transistors in the pixel unit with the pixel electrode; and the reservation layer is arranged at a same layer as an active layer of the thin film transistor.

3. The array substrate according to claim 2, wherein the array substrate further comprises: a gate insulation layer between the active layer of the thin film transistor and a layer at which a gate of the thin film transistor is located, and an auxiliary layer located between the gate insulation layer and the base substrate; the auxiliary layer comprises at least one fourth via hole corresponding to the at least one first via hole in a one-to-one manner; and an orthographic projection of each of the at least one first via hole onto the base substrate, and an orthographic projection of a corresponding fourth via hole onto the base substrate have an overlapping area; and each of the at least one recess comprises one of the at least one first via hole, a corresponding second via hole, and a corresponding fourth via hole.

4. The array substrate according to claim 3, wherein each of the at least one fourth via hole comprises a tapered hole; and an angle between an inclined surface of the tapered hole, and an upper surface of the base substrate is greater than or equal to 15 degrees, and less than or equal to 75 degrees.

5. The array substrate according to claim 3, wherein the array substrate further comprises a plurality of gate lines, and a common electrode arranged at a same layer as the plurality of gate lines; and the auxiliary layer is arranged at a same layer as, and insulated from, the plurality of gate lines.

6. The array substrate according to claim 3, wherein the gate insulation layer comprises at least one third via hole corresponding to the at least one first via hole in a one-to-one manner; the orthographic projection of each of the at least one first via hole onto the base substrate, and an orthographic projection of a corresponding third via hole onto the base substrate have an overlapping area; and each of the at least one recess includes one of the at least one first via hole, a corresponding second via hole, a corresponding third via hole, and a corresponding fourth via hole.

7. The array substrate according to claim 2, wherein the array substrate further comprises a gate insulation layer between the active layer of the thin film transistor, and a layer at which a gate of the thin film transistor is located, wherein the gate insulation layer comprises at least one third via hole corresponding to the at least one first via hole in a one-to-one manner;

the orthographic projection of each of the at least one first via hole onto the base substrate, and an orthographic projection of a corresponding third via hole onto the base substrate have an overlapping area; and each of the at least one recess comprises one of the at least one first via hole, a corresponding second via hole, and a corresponding third via hole.

8. The array substrate according to claim 1, wherein reservation layer comprises a first sub-reservation layer and a second sub-reservation layer; and the array substrate further comprises a thin film transistor in the pixel unit with the pixel electrode; wherein the first sub-reservation layer is arranged at a same layer as a source of the thin film transistor, and the second sub-reservation layer is arranged at a same layer as an active layer of the thin film transistor.

9. The array substrate according to claim 8, wherein each of the first sub-reservation layer and the second sub-reservation layer includes at least one elliptical second via hole corresponding to the at least one first via hole in a one-to-one manner, and an orthographic projection of a long axis of each of the at least one elliptical second via hole arranged on the first sub-reservation layer onto the base substrate intersects with an orthographic projection of a long axis of a corresponding elliptical second via hole arranged on the second sub-reservation layer onto the base substrate.

10. The array substrate according to claim 9, wherein an orthographic projection of a center of each of the at least one elliptical second via hole arranged on the first sub-reservation layer onto the base substrate overlaps with an orthographic projection of a center of the corresponding elliptical second via hole arranged on the second sub-reservation layer onto the base substrate.

11. The array substrate according to claim 1, wherein an angle between the orthographic projection of the long axis of each of the at least one second via hole onto the base substrate, and the orthographic projection of the long axis of the corresponding first via hole onto the base substrate is greater than 0 degree, and less than or equal to 90 degrees.

12. The array substrate according to claim 11, wherein the angle between the orthographic projection of the long axis of each of the at least one second via hole onto the base substrate, and the orthographic projection of the long axis of the corresponding first via hole onto the base substrate is equal to or greater than 35 degrees, and less than or equal to 75 degrees.

13. The array substrate according to claim 1, wherein the array substrate further comprises a thin film transistor in each of the at least a part of the plurality of pixel units, a gate insulation layer between an active layer of the thin film transistor and a layer at which a gate of the thin film transistor is located, and an auxiliary layer located between the gate insulation layer and the base substrate;

the gate insulation layer comprises at least one third via hole in each of the at least a part of the plurality of pixel units, the auxiliary layer comprises at least one fourth via hole corresponding to the at least one third via hole in a one-to-one manner;

an orthographic projection of each of the at least one third via hole onto the base substrate, and an orthographic projection of a corresponding fourth via hole onto the base substrate have an overlapping area; and each of the at least one recess comprises one of the at least one third via hole, and a corresponding fourth via hole.

14. The array substrate according to claim 13, wherein the array substrate further comprises a reservation layer between the pixel electrode in each of the at least a part of the plurality of pixel units and the base substrate, the reservation layer is arranged at a same layer as the active layer of the thin film transistor, and the reservation layer comprises at least one second via hole corresponding to the at least one third via hole in a one-to-one manner;

an orthographic projection of each of the at least one second via hole onto the base substrate, and an orthographic projection of a corresponding third via hole onto the base substrate have an overlapping area; and each of the at least one recess comprises one of the at least one third via hole, a corresponding fourth via hole and a corresponding second via hole.

15. A liquid crystal display panel, comprising the array substrate according to claim 1.

16. A display device, comprising the liquid crystal display panel according to claim 15.

17. The array substrate according to claim 1, wherein the array substrate further comprises a plurality of data lines and a plurality of gate lines; and the reservation layer is arranged at a same layer as the plurality of data lines; or the reservation layer is arranged at a same layer as the plurality of gate lines.

18. The array substrate according to claim 1, wherein each of the at least one recess is on an upper surface of the base substrate; and a thickness of the base substrate in an area where each of the at least one recess is located is less than a thickness of the base substrate in the other areas.

* * * * *